United States Patent [19]

Kakinoki et al.

[11] Patent Number: 4,970,626
[45] Date of Patent: Nov. 13, 1990

[54] ELECTROLYTIC CAPACITOR AND METHOD OF PREPARING IT

[75] Inventors: Yoshiaki Kakinoki, Kyoto; Katsunori Matsuda, Nara; Ryoichi Shimatani, Kyoto; Nobuyoshi Kanzaki, Kyoto; Iwao Tajima, Osaka; Kazunori Fujikawa, Kyoto, all of Japan

[73] Assignee: Matsushita Electric Industrial Co., Ltd., Japan

[21] Appl. No.: 360,932

[22] PCT Filed: Jul. 28, 1988

[86] PCT No.: PCT/JP88/00757
§ 371 Date: Mar. 29, 1989
§ 102(e) Date: Mar. 29, 1989

[87] PCT Pub. No.: WO89/01230
PCT Pub. Date: Feb. 9, 1989

[30] Foreign Application Priority Data

Jul. 30, 1987 [JP] Japan ................... 62-190728
Jul. 30, 1987 [JP] Japan ................... 62-190729
Jul. 30, 1987 [JP] Japan ................... 62-190730
Jul. 30, 1987 [JP] Japan ................... 62-190731

[51] Int. Cl.$^5$ ............................ H01G 9/02
[52] U.S. Cl. ...................... 361/512; 29/25.03
[58] Field of Search ............. 361/508, 509, 512, 511, 361/523, 525, 529, 530, 532; 29/570.1

[56] References Cited

U.S. PATENT DOCUMENTS

| 2,647,079 | 7/1953 | Burnham | 361/512 X |
| 2,722,637 | 11/1955 | Brennan | 361/530 |
| 3,245,888 | 4/1966 | West et al. | 361/511 X |
| 4,309,810 | 1/1982 | Drake | 361/511 X |

FOREIGN PATENT DOCUMENTS

61-180420 8/1986 Japan .
61-214420 9/1986 Japan .

Primary Examiner—Donald A. Griffin
Attorney, Agent, or Firm—Lowe, Price, LeBlanc, Becker & Shur

[57] ABSTRACT

The present invention is an electrolytic capacitor comprising a titanium-deposited aluminum foil used as the cathode. An aluminum foil is subjected to vacuum deposition of titanium with a deposition angle, thereby obtaining an electrolytic capacitor having a larger electrostatic capacitance than the conventional.

10 Claims, 4 Drawing Sheets

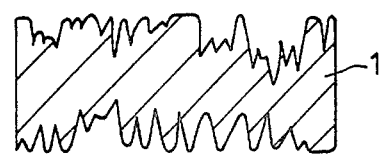
FIG. 1a
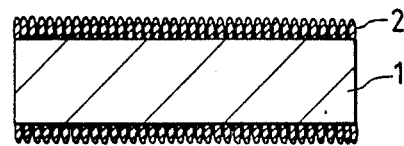
FIG. 1b
FIG. 2
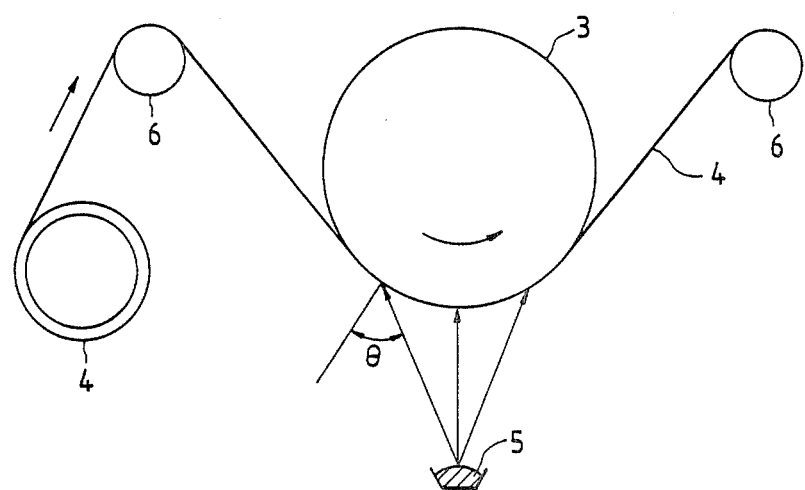

ELECTROLYTIC CAPACITOR AND METHOD OF PREPARING IT

TECHNICAL FIELD

The present invention relates to an electrolytic capacitor using aluminum as electrode foil, utilized in various electronic equipments, and a method of preparing it.

BACKGROUND ART

Electrolytic capacitors of this type have been hitherto constituted of an anode foil on which an anodized dielectric film is formed, comprising a high purity aluminum foil electrolytically etched to expand its effective areas and then subjected to formation treatment, and a cathode foil employing an aluminum foil electrolytically etched to expand its effective areas, which foils are wound interposing a separator followed by impregnation with a driving electrolyte (hereinafter "paste").

Such electrolytic capacitors used in commonly available electronic equipments are strongly demanded to be made more compact and thinner with the trend of making various electronic equipments more compact and thinner.

Incidentally, the capacitance C of electrolytic capacitors is the composite capacitance of the anode capacitance $C_\oplus$ with the cathode capacitance $C_\ominus$, and represented by the following formula:

$$C = \frac{C_\oplus C_\ominus}{C_\oplus + C_\ominus}$$

Accordingly, it has been attempted to increase not only the electrostatic capacitance of the anode foil but also that of the cathode foil, but an excessive etching causes surface dissolution of aluminum foils to proceed and prevents the electrostatic capacitance from increasing, and also the etching resulting from non-uniform dissolution brings about an extreme lowering of foil strength, so that, since the foils are made to have smaller widths to make them compact, it has been further impossible to wind foils in a high speed, thus leaving a limit in increasing the electrostatic capacitance of cathode foils by using electrolytic etching techniques.

As a means for improving it, it is known to form a titanium-deposited film on the roughened surfaces of aluminum foils (for example, Japanese Unexamined Patent Publications No. 180420/1986 and No. 214420/1986).

The cathode foils obtained by such a titanium vacuum deposition process can have a greater surface area and a more increased electrostatic capacitance than those obtained by the electrolytic etching process, but have had the disadvantages that they have too dense a structure to be impregnated with the paste with ease and therefore the electrostatic capacitance can be effectively exhibited with difficulty as capacitors.

They also have had the disadvantage that a lowering of capacitance is caused when vacuum deposition is continuously carried out.

DISCLOSURE OF THE INVENTION

The present invention aims at eliminating these disadvantages conventionally involved, and an object thereof is to provide an electrolytic capacitor that employs a high-capacitance cathode foil obtainable as a result of studying titanium vacuum deposition.

Namely, the present invention employs as the cathode foil an aluminum foil obtained by vacuum deposition of titanium with a deposition angle on the deposition surface, said vacuum deposition being carried out in an argon gas atmosphere kept within the range of from $1.0 \times 10^{-5}$ to $1.0 \times 10^{-4}$ Torr, while controlling to from 50° to 200° C. the temperature on the deposition surface of an aluminum foil substrate made to have an enlarged surface area.

Such titanium vacuum deposition results in the formation of a titanium film with a rough column-like structure comprising columns independent from each other. Employment of such an electrode enables the titanium column-like structure film to be impregnated with the paste through its details, resulting in an increase in the effective surface area, an improvement in the electrostatic capacitance, and an improvement in the electrostatic capacitance of electrolytic capacitors.

BRIEF DESCRIPTION OF THE DRAWINGS

FIGS. 1-a and 1-b are cross sections of aluminum foils;

FIG. 2 is a schematic view to illustrate a vacuum deposition method by which the deposition angle $\theta$ is given;

BEST MODES FOR WORKING THE INVENTION

Examples of the present invention will be described below.

The present inventors made various studies on instances in which vacuum deposition is carried out on aluminum foil substrate. The items of these studies included the deposition angle, temperature, atmosphere, etc., and studies were also made on the characteristics of electrolytic capacitors by using as the cathode the aluminum foils subjected to vacuum deposition under various conditions.

(Example 1)

In the first place, studies were made on the deposition angle.

Enlarged model cross sections of titanium vacuum deposited film structures are shown in FIG. 1. FIG. 1(a) shows a structure of a film formed by conventional etching, and FIG. 1(b) is a model view of a titanium vacuum deposited film formed with the deposition angle according to the present invention. As a result of various studies so made that rough titanium vacuum deposited films can be obtained, giving the deposition angle ($\theta$) gives $1/\cos \theta$ per unit area with increase in the angle $\theta$, resulting in rough vacuum deposition, so that the film can have the column-like structure as in FIG. 1(b), comprising columns independent from each other.

In industrial actual manufacture, giving the deposition angle $\theta$ results in a poor deposition efficiency, and also requires a very large-scale vacuum deposition apparatus. Taking account of these, an idea was conceived that the vacuum deposition may be so carried out that nuclei may be formed on an aluminum foil substrate 1 at the initial stage of titanium vacuum deposition to cause a titanium film 2 with a rough column-like structure to grow. Further studies were made based on such an idea, to find that, as illustrated in FIG. 2, a revolving roll (which may be a square roll, but commonly a round roll) 3 may be used in order to give the deposition angle $\theta$ and yet carry out mass production. In FIG. 2, the numeral 4 denotes aluminum foil; 5, titanium; and 6, a roll.

With an angle given in this way, nuclei with a rough column-like structure may be deposited and thereafter the film thickness may be made to continuously grow at the part where a deposited film is formed with a good deposition efficiency and with a small deposition angle, whereby it becomes possible to continuously and efficiently produce titanium vacuum deposited films having rough column-like structures.

Specific examples of the present invention will be described below.

Figure 3:
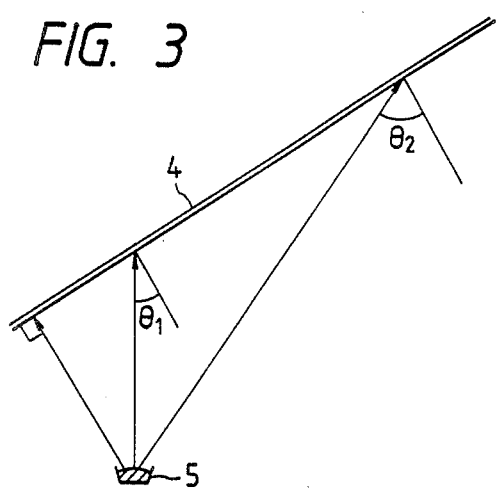
FIGS. 3 and 4 are views to show the relationship between the vacuum deposition angle and capacitance.
Figure 4:
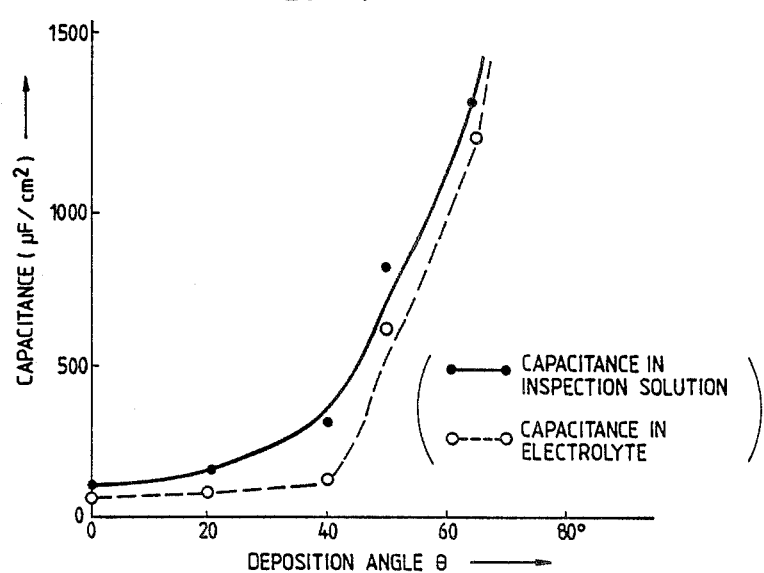

First, to evidence the effect of the deposition angle $\theta$, the deposition angle was fixed as shown in FIG. 3, and the relationship between the deposition angle and capacitance, particularly when deposition was carried out to give a film thickness of 1.0 $\mu$m, provided that the film thickness smaller than it was calculated as a thickness of 1.0 $\mu$m, is shown in Table 1 and FIG. 4. The capacitance was measured using a capacitance inspection solution (composed of 80 g of ammonium borate and 1,000 ml of water, and having a specific resistance of $100\pm10$ $\Omega$.cm (30° C.)) and a paste (composed of 10 g of ammonium adipate, 80 g of ethylene glycol and 10 g of water, as well as small amounts of additives, and having a specific resistance of $150\pm5$ $\Omega$.cm (30° C.)).

As electrode foil samples for the measurement, two sheets of samples with a dimension of 2.0 cm $\times$ 1.0 cm were set opposing to carry out the measurement respectively in the above inspection solution and paste at 0.5 Vrms, 120 Hz and a direct bias of 0 V, and the measurements were calculated in terms of a unit area of 1.0 cm$^2$.

As conditions for preparing the samples, the vacuum deposition was carried out in an argon gas atmosphere at a vacuum degree of $2\times10^{-5}$ Torr in a vacuum apparatus, using electron beams as an energy source, where titanium was deposited with a film thickness of 1.0 $\mu$m, or the film thickness was calculated as 1.0 $\mu$m, to obtain the results as shown in Table 1 and FIG. 4. The unit is expressed by $\mu$F/cm$^2$.

However, as will be seen from FIG. 3, because of the angles given under the same conditions, the distance from the deposition source to the aluminum foil substrate differs, so that the deposition efficiency (film thickness) is lowered in inverse proportion to the second power of the distance, which is therefore calculated in terms of film thickness and shown in Table 1.

TABLE 1

| Deposition angle $\theta$ | 0° | 20° | 40° | 50° | 65° |
|---|---|---|---|---|---|
| Inspection solution | 108 | 151 | 310 | 818 | 1,350 |
| Paste | 63 | 82 | 128 | 611 | 1,215 |
| Capacitance ratio (Paste/Inspection solution) | 58% | 54% | 42% | 75% | 90% |

As will be seen from this Table 1 or FIG. 4, the capacitance becomes higher as the deposition angle $\theta$ becomes greater in $\theta_2$ than $\theta_1$. Also, a smaller deposition angle $\theta$ gives a denser column-like structure, so that the column-like structure can be impregnated through its inside with the inspection solution with difficulty, and the paste, which has a larger molecule and with which the column-like structure can be impregnated with difficulty, may be more greatly influenced. On the other hand, with increase in the deposition angle $\theta$, a rougher column-like structure results, so that it can be sufficiently impregnated through its inside with the inspection solution or paste, resulting in great exhibition of the capacitance. In particular, a large capacitance was found to have become obtainable using the paste actually used with which the capacitance has been hitherto exhibited with difficulty, and thus the products obtained can be used as large capacitance cathode foils for use in capacitors.

Next, an example will be described below in which trial production was carried out giving the deposition angle and under continuous foil traveling, using the above apparatus as shown in FIG. 2, which takes account of industrial mass production. Foils were produced in an argon gas atmosphere and at a vacuum degree of $5\times10^{-4}$ Torr as vacuum deposition conditions, using electron beams as an energy source at an output of 6 kW, and at a foil travel speed of 1.0 m/min with a titanium-deposited film thickness of 1.0 $\mu$m, and the products were subjected to the measurement in the inspection solution previously described and also in the paste previously described. Results obtained are shown in Table 2. As comparative products, samples were used which were prepared under the same vacuum conditions, fixing the deposition angle to 0°, and according to electron beam vacuum deposition with a titanium film thickness of 1.0 $\mu$m. Namely, these are in accordance with conventional titanium vacuum deposition conditions.

TABLE 2

|  | Products of the invention | Comparative products |
|---|---|---|
| Inspection solution | 1,480 | 800 |
| Paste | 1,203 | 300 |

Thus, an increase in the capacitance was achieved by the factor of as great as about 4 times that of the conventional foil, in the paste which is used in the actual use as electrolytic capacitors.

Also, capacitors were prepared using titanium-deposited aluminum foils with the deposition angle according to the present invention (foils produced under the same conditions as the above) and comparative foils (the above titanium-deposited foils with a deposition angle of 0°), which were respectively used as cathode foils. Results are shown in Table 3.

The capacitors had an external size of 6.3 mm$\phi\times$5 mm length, and were constructed by using aluminum foils as anode foils, having a foil thickness of 90 $\mu$m and an electrostatic capacitance of 3,000 $\mu$F/10 cm$^2$ for use in 2 W.V., and impregnating the foils with the above paste.

The electrolytic capacitors had the same construction as the construction of the conventional products, and the titanium-deposited foils prepared under conditions according to the present invention were used as the cathode.

TABLE 3

| Sort of capacitor: | | |
|---|---|---|
| | Capacitor of the invention | Conventional capacitor |
| Cathode | Titanium-deposited foil with deposition angle | Titanium-deposited foil with 0° deposition angle |
| Capacitance | 480 µF | 293 µF |

Thus, the capacitance has increased by 64% as compared with the capacitor in which the conventional titanium-deposited foil is used.

(Example 2)

Figure 5:
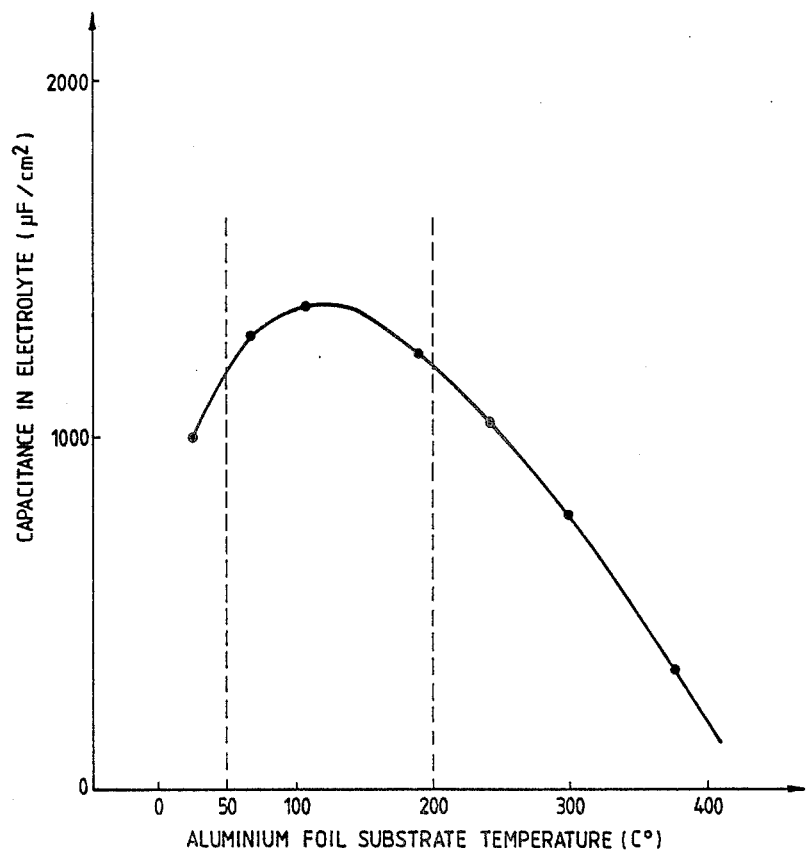
FIG. 5 is a view to show the relationship between the deposition temperature and capacitance.

Next, studies were made on the deposition temperature. The temperatures of the aluminum foil 4 were controlled to 25° to 400° C. and titanium was vacuum deposited, and capacitance values in a driving electrolyte, thus obtained, are shown in FIG. 5. As is evident from this FIG. 5, the capacitance is seen to have been improved when the temperatures of the aluminum foil 4 are in the range of from 50° to 200° C.

Thus, the titanium-deposited film with the rough structure, suited to electrode foils for use in electrolytic capacitors, is seen to have been formed in the range of from 50° to 200° C.

Cathode foils obtained in the above way were built in aluminum electrolytic capacitors, the results from which are shown in Table 4.

TABLE 4

(Rated voltage: 4V; case size: θ8 × 7)

| Temperature of the deposit surface (°C.) | Electrostatic capacitance of electrode foil (µF/cm$^2$) | Electrostatic capacitance of aluminum electrolytic capacitor (µF) |
|---|---|---|
| 25 | 1,000 | 424 |
| 120 | 1,370 | 560 |
| 250 | 1,000 | 406 |

As shown in Table 4, in the typical example of the present invention, where the foil having been subjected to vacuum deposition at 120° was built in the electrolytic capacitor as the cathode foil, the electrostatic capacitance thereof is greatly enhanced.

Also, with respect to the decrease in capacitance owing to the continuous vacuum deposition, the present invention takes note of the fact that the heat from the vacuum deposition source raises the foil temperature in carrying out the vacuum deposition for titanium-deposited foils, and hence a film which is dense and has a small surface area is formed, resulting in a lowering of the capacitance. These phenomena can be observed using a high-magnification electron microscope. To give the column-like structure, it is required for the temperature to be set to from 50° to 200° C.

In carrying out the continuous vacuum deposition, however, the aluminum foil substrate is gradually heated by the heat from the vacuum deposition source, until it is heated to a high temperature of 200° C. or more. For this reason, it was noted to cool this heated substrate, and thus, in particular, the roll coming into close contact therewith in carrying out the vacuum deposition is internally cooled using water or a refrigerant, thereby preventing the temperature of the aluminum foil substrate from being raised, so that there can be taken the rough column-like structure with a large surface area.

The refrigerent may take the form of gas or liquid, but the gas is not suitable because of its small thermal conductivity and thermal capacity, and liquids, water or halogen solvents, are preferred, and there can be applied a circulation system, a discharging system, etc. in variety. These can be freely selected taking account of cost, efficiency, etc.

To increase the cooling efficiency, a mere bath roll may also be used as a cooling roll to increase the heat dissipation effect of the aluminum foil substrate.

Figure 6:
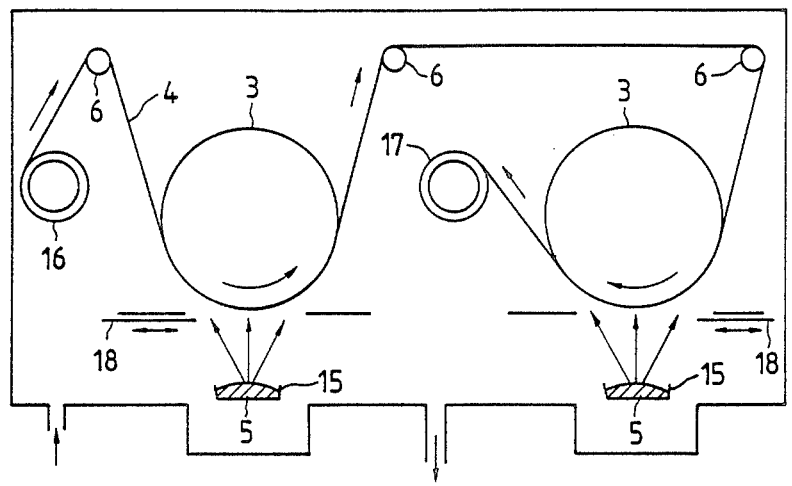
FIG. 6 is a schematic view of a vacuum deposition apparatus for use in mass-production.

A specific vacuum deposition apparatus is schematically illustrated in FIG. 6.

The aluminum foil 4 is unrolled in the inside of a vacuum chamber by means of a let-off roll 16, and titanium 5 heated in a crucible 15 is deposited on each surface using a vacuum deposition roll. The resulting foil is let to travel toward a roll-up roll 17 and rolled up there. In the course of the traveling path, the aluminum foil 4 passes on several rolls 6, so that its travel direction is changed. A shutter 18 is closed until the depositing titanium 5 become stable by preliminary dissolution or the like so that vacuum deposition of titanium may be prevented.

It is a characteristic feature that the vacuum deposition is carried out while cooling this vacuum deposition roll 3 or optionally the rolls 6.

An example of the present invention will be described below using specific data. In the example, the vacuum deposition roll 3 in FIG. 6 was made to comprise a roll of a water-cooling type, and the vacuum deposition was carried out under water cooling.

As vacuum deposition conditions, the vacuum deposition was carried out in an argon gas atmosphere at a vacuum degree of $2 \times 10^{-4}$ Torr and at a vacuum deposition foil travel speed of 2 m/min, using a vacuum deposition source energy with an EB (electron beam) output of 8 kW. Two sheets of samples with a dimension of 2.0 cm × 1.0 cm were set opposing to carry out the measurement of the foil capacitance in a capacitance inspection solution.

Composition of the capacitance inspection solution:

| Ammonium borate | 80 g |
|---|---|
| Water | 1,000 g |

Specific resistance: 100±10 Ω.cm (30° C.)

The vacuum deposition was continuously carried out over a length of 100 m, and sampling was carried out at intervals of 10 m to carry out the measurement. Results obtained are shown in Table 5.

TABLE 5

| Roll used | The beginning of deposition, 1 m | 10 m (roll temp.) | 20 to 100 m (roll temp.) | Remarks |
|---|---|---|---|---|
| Conventional roll | 1,205 (25° C.) | 504 (58° C.) | 275 to 481 (67 to 213° C.) | X |
| Cooling roll | 1,310 (22° C.) | 1,283 (23° C.) | 1,165 to 1,342 (22 to 23° C.) | Y |

*In the parentheses, roll temperatures are given, which are values measured with a thermocouple in the roll.
X: Capacitance greatly changed, resulting in a lowering of capacitance.
Y: A large capacitance with less scattering of capacitance.

As shown in Table 5, the foil on which the vacuum deposition was carried out using the cooling roll keeps a large capacitance level with less scattering of capacitance, and thus the cooling roll is seen to bring about a very great effect.

Figure 7:
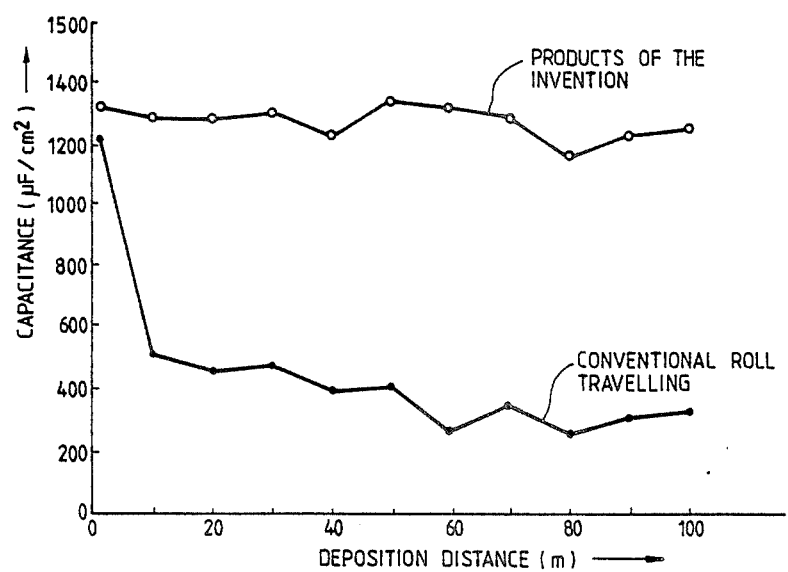
FIG. 7 is a view to show the relationship between the deposition distance and capacitance.

FIG. 7 shows capacitance values measured at intervals of 10 m.

Also, the capacitor of the present invention, in which the aluminum foil, deposited with titanium using the cooling roll, was used as the cathode was compared with the capacitor in which the cathode formed by the conventional electrolytic etching process was used, and the characteristics thereof are shown in Table 6. In both cases, the anode comprises an aluminum foil formed under the same conditions.

The capacitance of the cathode is 1,210 $\mu$F/cm$^2$ in respect of the titanium-deposited cathodes, and 308 $\mu$F/cm$^2$ in respect of the above comparative cathode. The products had a dimension of 8 mm$\phi \times$ 7 mm length, and a titanium film thickness of about 1 $\mu$m. The capacitance measurement solution is composed of 80 g of ammonium borate and 1,000 ml of water, and has a specific resistance of 100±10 $\Omega$.cm (30° C.). Used as the paste was the one composed of 10 g of antimon adipate, 80 g of ethylene glycol and 10 g of water, as well as small amounts of additives, and having a specific resistance of 150±5 $\Omega$.cm (30° C.)).

As electrode foil samples for the measurement, two sheets of samples with a dimension of 2.0 cm $\times$ 1.0 cm were set opposing to carry out the measurement respectively in the above capacitance measurement solution and driving electrolyte.

The vacuum degree was first adjusted to 10$^{-7}$ Torr or less, and argon gas was fed to set the respective vacuum degrees. If oxygen gas or nitrogen gas is present, reaction may occur to form titanium oxide or titanium nitride to bring about differences in states, and therefore a high vacuum was once produced and then unreactive inert argon gas was fed to adjust the vacuum degrees. As the inert gas, helium gas or the like may be satisfactory, but the argon gas, which exists in a large quantity and is readily available with a low cost, was used taking account of the cost.

As shown in Table 6, a low vacuum with a vacuum degree of from 1.0$\times$10$^{-5}$ to 10$\times$10$^{-4}$ Torr results in the rough film structure, making it possible to obtain a large capacitance. Further, the lower vacuum is given, the larger capacitance can be obtained. However, a low vacuum of 10$^{-3}$ Torr results in excessively frequent collisions of argon gas against titanium vapor to worsen deposition efficiency and also lower the capacitance. Moreover, the low vacuum of 10$^{-3}$ Torr brings about an ion bombardment phenomenon of argon gas, which causes cut-off of a filament of the energy-generating source during its use for a short period of time, resulting in a short lifetime, and further enables no continuous use because of the condition to readily cause abnormal discharge. Namely, the vacuum deposition of titanium at vacuum degrees of from 1.0$\times$10$^{-5}$ to 10$\times$10$^{-4}$ Torr brings about the film structure that can obtain a large capacitance, which are conditions under which a good vacuum deposition efficiency, i.e., a good productivity can be achieved.

Table 6 shows the capacitance measured in the capacitance measurement solution and paste.

TABLE 6

(Unit of vacuum degree: Torr; unit of capacitance: $\mu$F/cm$^2$)

| Torr | Vacuum degree: | | | |
|---|---|---|---|---|
| | 8 $\times$ 10$^{-4}$ | 2 $\times$ 10$^{-5}$ | 8 $\times$ 10$^{-5}$ | 2 $\times$ 10$^{-4}$ |
| Measurement solution $\mu$F/cm$^2$ | 493 | 1,020 | 1,131 | 1,352 |
| Paste $\mu$F/cm$^2$ | 87 | 681 | 925 | 1,040 |

| Torr | Vacuum degree: | | | |
|---|---|---|---|---|
| | 5 $\times$ 10$^{-4}$ | 8 $\times$ 10$^{-4}$ | 2 $\times$ 10$^{-3}$ | 5 $\times$ 10$^{-3}$ |
| Measurement solution $\mu$F/cm$^2$ | 1,393 | 1,504 | 1,361 | 1,001 |
| Paste $\mu$F/cm$^2$ | 1,122 | 1,190 | 1,135 | 908 |

The foregoing is summarized in Table 7.

TABLE 7

| Vacuum degree | Capacitance | Others |
|---|---|---|
| High vacuum of 10$^{-6}$ Torr or more | Dense film structure with a small capacitance. | |
| 10$^{-5}$ to 10$^{-4}$ Torr | Rough film structure with a large capacitance. The lower the vacuum is (10$^{-4}$ Torr), the larger the capacitance is. | No abnormality in continuous operability, etc. |
| Low vacuum of not more than 10$^{-3}$ Torr | Rough film structure with a large capacitance, but a lowering of deposition efficiency with a decrease in capacitance. | Liable to abnormal discharge. Filament is liable to cut-off. (Continuous production impossible, accordingly). |

TABLE 8

| Sort of product | Cathode foil used | Cathode foil capacitance ($\mu$F/cm$^2$) | Product capacitance ($\mu$F) |
|---|---|---|---|
| Product of the invention | Titanium-deposited aluminum foil | 1,210 | 1,103 |
| Conventional product | Electrolytic etching foil | 308 | 441 |

As shown in Table 8, it was also possible to obtain a capacitance of 2.5 times by only changing the cathode foil under the same conditions.

The capacitance of the cathode formed without use of the cooling roll becomes smaller under the influence of heat, to have the same level as the conventional electrolytic etching foil, resulting, moreover, in scattering of the capacitance.

(Example 3)

The present inventors also made studies on vacuum degrees.

In general, the vacuum deposition is carried out at a high vacuum degree so that adhesion can be enhanced and a dense film can be prepared. In the present invention, the vacuum degrees were studied taking note of conversely making larger the surface area, in other words, preparing a rough film, in order to increase the capacitance, and this was made possible by carrying out vacuum deposition of titanium at a low vacuum degree. This is based on the mechanism that titanium vapor collides against gaseous molecules between the vacuum deposition source and vacuum deposition substrate (herein the argon gas molecules which are in the space in which the titanium reaches the vacuum deposition substrate and adheres thereon) to make kinetic energy smaller, thus forming a rough film structure.

Using as the cathode the titanium-deposited foil prepared in this way at $5\times10^{-4}$ Torr which is within the range of vacuum deposition conditions of the present invention, an electrolytic capacitor was experimentally prepared to obtain the results as shown below. A foil subjected to 5 V formation was used as a cathode foil, and a capacitor comprising a cathode foil formed by the conventional etching process and having a capacitance of 300 $\mu F/cm^2$ was used as a comparative capacitor. If the product has a dimension of 6.3 mm in diameter and 7 mm in length, the electrolytic capacitor of the present invention can obtain a capacitance of 612 $\mu F$, but the comparative capacitor can only obtain a capacitance of 285 $\mu F$, which is not more than the half. The values are shown in Table 9.

TABLE 9

| | Dimension ($\phi \times 1$) | Capacitance |
|---|---|---|
| Capacitor of the invention | 6.3 mm $\times$ 7 mm | 612 $\mu F$ |
| Capacitor comprising the conventional cathode | 6.3 mm $\times$ 7 mm | 285 $\mu F$ |

Thus, the electrolytic capacitor of the present invention, which employs as the cathode the aluminum foil vacuum-deposited with titanium in an argon atmosphere at a vacuum degree of from $1.0\times10^{-5}$ to $10\times10^{-4}$ Torr, can be compact and obtain a large capacitance.

POSSIBILITY OF INDUSTRIAL UTILIZATION

As described in the above, the electrolytic capacitor which employs as the cathode the titanium-deposited aluminum foil according to the present invention, can achieve a great increase in the electrostatic capacitance, can be made very compact, can be made thinner, can be made to have a large capacitance, bringing about great advantages in the equipments to be used, and yet can be continuously produced, having a great effect of mass production when produced, so that it can achieve a great improvement in the production cost or the like, thus making a great contribution to industries.

We claim:

1. A method for producing an electrolytic capacitor which comprises, providing a cooling roll on which an aluminum foil substrate is to be deposited with titanium at a deposition angle which allows formation of rough column-like structures, continuously passing an aluminum foil substrate in close contact with said cooling roll while keeping the temperature of said aluminum foil substrate in the range of from 50° to 200° C., subjecting said aluminum foil substrate to vacuum deposition with titanium on the surface of said cooling roll in an atmosphere of argon gas at a degree of vacuum of from $1.0\times10^{-5}$ to $1.0\times10^{-4}$ Torr, tnereby forming a cathode foil, winding said cathode foil together with an anode foil with a separator interposed therebetween to form a capacitor unit, and impregnating said capacitor unit with a driving electrolyte.

2. A method according to claim 1, wherein said deposition angle is gradually varied during said deposition of said titanium.

3. A method according to claim 1, wherein said deposition angle at an initial stage of said deposition is 40° or greater.

4. A method of producing an electrolytic capacitor according to claim 3, wherein the temperature of said aluminum foil substrate is maintained in the range of from 50° to 200° during said vacuum deposition.

5. A method of producing an electrolytic capacitor according to claim 3, wherein said aluminum foil substrate travels in close contact with a cooling roll whereat said vacuum deposition takes place.

6. A method of producing an electrolytic capacitor according to claim 3, wherein said vacuum deposition is conducted in an argon atmosphere which is maintained at a pressure of from $1.0\times10^{-5}$ to $1.0\times10^{-4}$ Torr.

7. A method of producing an electrolytic capacitor according to claim 3, wherein said deposition angle is gradually varied during said deposition of said titanium.

8. A method of producing an electrolytic capacitor according to claim 3, wherein said deposition angle $\phi_1$ is 40° or greater.

9. An electrolytic capacitor, comprising a cathode foil and an anode foil which are wound interposing a separator and thereafter impregnated with an electrolyte, said cathode foil being produced by applying titanium to an aluminum foil substrate, said titanium being initially applied by vacuum deposition at an initial angle $\phi_1$ to form nuclei with a rough column-like structure and, thereafter applying said titanium by vacuum deposition at a second angle $\phi_2$, wherein $\phi_1 > \phi_2$, to continuously grow a film having column-like structures.

10. A method of producing an electrolytic capacitor comprising, causing an aluminum foil substrate to continuously travel onto the surface of a roll, applying titanium to said aluminum foil substrate, said titanium being initially applied by vacuum deposition at an initial angle $\phi_1$ to form nuclei with a rough column-like structure and, thereafter applying said titanium by vacuum deposition at a second angle $\phi_2$, wherein $\phi_1 > \phi_2$, to continuously grow a film having column-like structures so as to form a cathode foil, and winding said cathode foil together with an anode foil with a separator interposed therebetween to form a capacitor device.

* * * * *